(12) United States Patent
Zhong et al.

(10) Patent No.: US 8,513,780 B2
(45) Date of Patent: Aug. 20, 2013

(54) SEMICONDUCTOR DEVICE HAVING INTER-LEVEL DIELECTRIC LAYER WITH HOLE-SEALING AND METHOD FOR MANUFACTURING THE SAME

(75) Inventors: Huicai Zhong, Beijing (CN); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/141,001

(22) PCT Filed: Feb. 26, 2011

(86) PCT No.: PCT/CN2011/071344
§ 371 (c)(1),
(2), (4) Date: Jun. 20, 2011

(87) PCT Pub. No.: WO2011/160466
PCT Pub. Date: Dec. 29, 2011

(65) Prior Publication Data
US 2012/0217623 A1 Aug. 30, 2012

(30) Foreign Application Priority Data
Jun. 22, 2010 (CN) .......................... 2010 1 0215116

(51) Int. Cl.
H01L 23/58 (2006.01)
H01L 27/088 (2006.01)
H01L 21/70 (2006.01)
H01L 29/40 (2006.01)
H01L 21/4763 (2006.01)

(52) U.S. Cl.
USPC ........... 257/635; 257/396; 257/522; 257/751; 438/623

(58) Field of Classification Search
USPC .......... 257/396, 522, 751, 758–759; 438/623
See application file for complete search history.

(56) References Cited

U.S. PATENT DOCUMENTS

| | | | | |
|---|---|---|---|---|
| 5,936,295 A * | 8/1999 | Havemann et al. | ........... | 257/522 |
| 6,140,200 A * | 10/2000 | Eldridge | ....................... | 438/396 |
| 6,432,811 B1 | 8/2002 | Wong | | |
| 6,620,727 B2 * | 9/2003 | Brennan | ...................... | 438/637 |
| 6,825,098 B2 | 11/2004 | Gabric et al. | | |
| 7,023,063 B2 | 4/2006 | Gabric et al. | | |
| 7,067,415 B2 * | 6/2006 | Li et al. | ........................ | 438/623 |

(Continued)

FOREIGN PATENT DOCUMENTS

| CN | 1495880 A | 5/2004 |
|---|---|---|
| CN | 1537330 A | 10/2004 |

(Continued)

OTHER PUBLICATIONS

Han et al, "Control of Anodic Aluminum Oxide Barrier Layer Opening Process by Wet Chemical Etching", Langmuir, 23, pp. 1564-1568 (2007).*

(Continued)

*Primary Examiner* — Long K Tran
*Assistant Examiner* — Dzung Tran
(74) *Attorney, Agent, or Firm* — Alston & Bird LLP

(57) ABSTRACT

The present invention discloses an inter-level dielectric layer for a semiconductor device, a method for manufacturing the same and a semiconductor device having said inter-level dielectric layer. The method lies in forming non-interconnected holes within a dielectric layer, and these holes may be filled with porous low-k dielectric material with a much lower dielectric constant, or forming holes within the dielectric layer by filling the upper parts of the holes. The inter-level dielectric layer in such a structure has a much lower dielectric constant, reduces RC delay between devices of integrated circuits and also is easy to integrate; besides, since the holes within the dielectric layer are non-interconnected, they shall not cause change to the dielectric constant of the dielectric material or a short circuit between wires, thus the device shall have better stability and reliability which then improve performance of the circuit.

17 Claims, 8 Drawing Sheets

(56) References Cited

U.S. PATENT DOCUMENTS

| | | | |
|---|---|---|---|
| 7,115,995 B2 | 10/2006 | Wong | |
| 7,329,600 B2 | 2/2008 | Clevenger et al. | |
| 2001/0002732 A1* | 6/2001 | Schwarzl et al. | 257/758 |
| 2004/0084749 A1* | 5/2004 | Pamler et al. | 257/522 |

FOREIGN PATENT DOCUMENTS

| | | |
|---|---|---|
| CN | 1677644 A | 10/2005 |
| CN | 101660187 B | 8/2011 |
| JP | 2003258095 A | 9/2003 |

OTHER PUBLICATIONS

International Search Report, mailed Jun. 9, 2011, of corresponding PCT/CN2011/071344.

The International Bureau of WIPO, Translation of the International Preliminary Report on Patentability for International Application No. PCT/CN2011/071344, mailed Jan. 10, 2013, 9 pages, Switzerland.

* cited by examiner

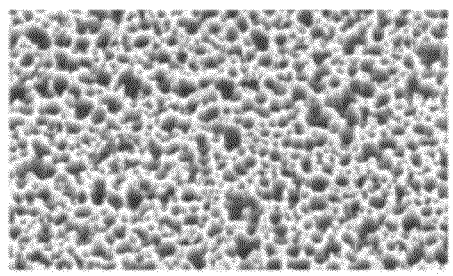
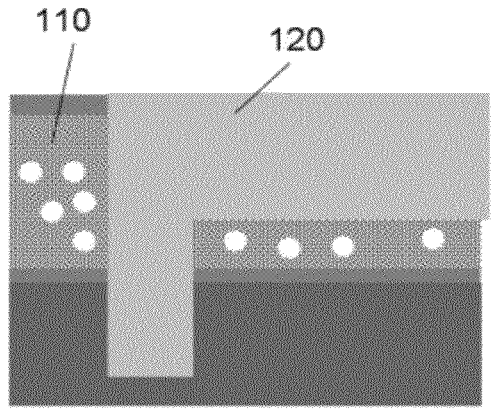
FIG.1A  FIG.1B
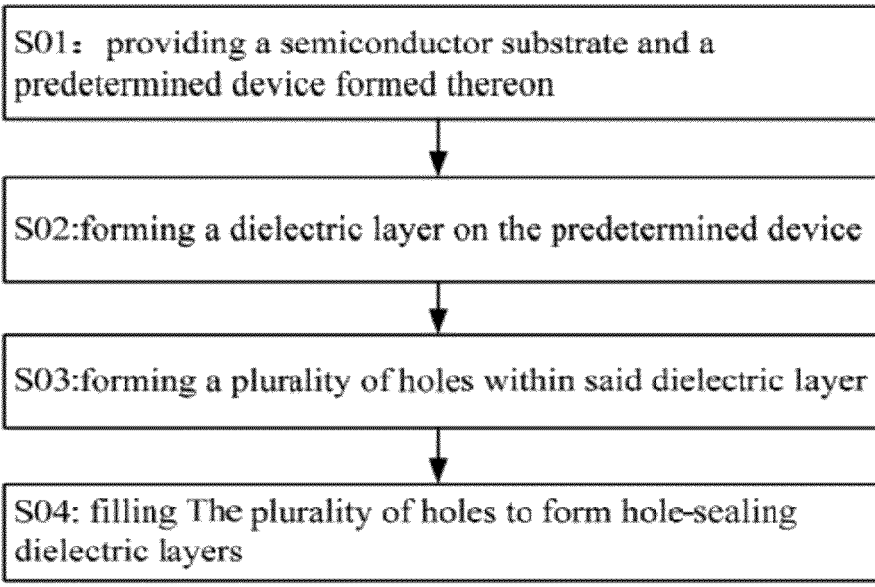
FIG. 2

SEMICONDUCTOR DEVICE HAVING INTER-LEVEL DIELECTRIC LAYER WITH HOLE-SEALING AND METHOD FOR MANUFACTURING THE SAME

CROSS REFERENCE TO RELATED APPLICATIONS

This application is a national stage application, filed under 35 U.S.C. §371, of International Application No. PCT/CN2011/071344, filed Feb. 26, 2011, which claims priority to Chinese Application No. 201010215116.9, filed Jun. 22, 2010, all of which are hereby incorporated by reference in their entirety.

FIELD OF INVENTION

The present invention generally relates to a semiconductor device, an inter-level dielectric layer of a semiconductor device and a method for manufacturing the same, and specifically, relates to an inter-level dielectric layer capable of reducing parasitic capacitance resulting in RC delay for a device, a method for manufacturing the same, and a semiconductor device having said inter-level dielectric layer.

BACKGROUND OF THE INVENTION

With development in the semiconductor technologies, all parts in integrated circuits need to be scaled further and are integrated more intensively, thus the number of the conductor wires in circuits is increasing with pitch and width of wires being reduced, which results in more serious parasitic effect between a resistor (R) and a capacitor (C) in conductor wire and causes serious transmission delay (RC Delay). In the advanced process, aforesaid issues become the major factors that limit signal transmission speed in circuits.

Metal Cu instead of Al has been widely used as material for conducting interconnect (or interior metal wiring layer) because of its high melting point, low resistivity and high anti-electron-migration capability, so as to reduce interconnect resistance. Besides, low dielectric constant (low-K) materials have been widely used to reduce parasitic capacitance. In 90 nm technology node process, high density low-k dielectric materials with dielectric constant in the range of 2.8-3.0 have been used to form inter-level dielectric layers, whereas in the process of 65 nm technology or beyond, requirements for porous low-k dielectric materials with a dielectric constant smaller than 2.4 have been proposed to use. These porous low-k dielectric materials, for example, porous MSQ, porous PAE, porous SiLK and porous $SiO_2$, have lower dielectric constants, and are able to further reduce parasitic capacitance and improve circuit speed. However, these materials have such disadvantages as delamination, cohesive cracking and diffusion, as shown in FIGS. 1A and 1B. FIG. 1A illustrates a partially enlarged view of a porous low-k dielectric material, and FIG. 1B illustrates an inter-level dielectric layer 110 made of said porous low-k dielectric material and a wire 120 formed therein. The inherent disadvantages of these materials bring forth significant challenges to the process integration. For example, the porous materials may delaminate or crack in a process involved with mechanical forces, for example, Chemical Mechanical polish (CMP), wafer cutting, wafer packaging or the like. Additionally, since the porous low-k dielectric material contains more than 20% holes, which are distributed irregularly and may also be continuous, the materials used in other processes, for example, a polishing material, a metal material or the like, shall diffuse into these holes, which may give rise to change of the dielectric constant of the dielectric material and shorts between wires 120, and even further impair the stability and reliability of the device.

Therefore, there is a need to propose an inter-level dielectric layer capable of reducing RC delay parasitic capacitance while being easy to integrate, a method for manufacturing the same and a semiconductor device having the inter-level dielectric layer.

SUMMARY OF THE INVENTION

The present invention provides a method for manufacturing an inter-level dielectric layer for a semiconductor device, comprising: providing a semiconductor substrate and a predetermined device formed thereon; forming a dielectric layer on the predetermined device; forming a plurality of holes within the dielectric layer, wherein these holes do not penetrate through the dielectric layer; filling the holes to form hole-sealing dielectric layers, wherein the upper surfaces of the hole-sealing dielectric layers are at the substantially flush with those of said dielectric layer. The dielectric layer may be formed by a non-porous dielectric material with a low dielectric constant; the hole-sealing dielectric layers in the holes may fill the holes completely or fill the upper parts of said holes; when the holes are completely filled by the hole-sealing dielectric layers, a porous dielectric material with a much lower dielectric constant is preferred.

The present invention further provides an inter-level dielectric layer for a semiconductor device; the device comprises a semiconductor substrate and a predetermined device formed thereon; the inter-level dielectric layer comprises: a dielectric layer formed on the predetermined device; a plurality of holes formed within the dielectric layer, wherein these holes do not penetrate through the dielectric layer; hole-sealing dielectric layers formed in the holes. The dielectric layer may be made of a non-porous dielectric material with a low dielectric constant; the hole-sealing dielectric layers in the holes may fill the holes completely or fill the upper parts of the holes; when the holes are completely filled by the hole-sealing dielectric layers, a porous dielectric material with a much lower dielectric constant is preferred.

The present invention further provides a semiconductor device having such an inter-level dielectric layer; the semiconductor device comprises: a semiconductor substrate and a predetermined device formed thereon; a dielectric layer formed on the predetermined device; a plurality of holes formed within the dielectric layer, wherein the holes do not penetrate through the dielectric layer; hole-sealing dielectric layers formed within the holes. The dielectric layer may be made of a non-porous dielectric material with a low dielectric constant; the hole-sealing dielectric layers in the holes may fill the holes completely or fill the upper parts of the holes; when the holes are completely filled by the hole-sealing dielectric layers, a dielectric material with a much lower dielectric constant is preferred.

According to the manufacture method of the present invention, non-interconnected holes are formed in a dielectric layer, and these holes may be filled with a porous low-k dielectric material with a much lower dielectric constant, alternatively, only the upper parts of the holes are filled so as to form holes in the dielectric layer. An inter-level dielectric layer in such a structure has a much lower dielectric constant, reduces RC delay between devices of integrated circuits and also is easy to integrate; besides, since the holes within the dielectric layer are non-interconnected, they shall not cause change to the dielectric constant of the dielectric material or a short circuit between the wires, thus the device shall have better stability and reliability which thence improve performance of the circuit.

BRIEF DESCRIPTION OF THE DRAWINGS

FIG. 1A illustrates a partially enlarged view of a porous low-k dielectric material in the prior art;

FIG. 1B illustrates a diagram of an interior metal dielectric layer made of a porous low-k dielectric material in the prior art;

FIG. 2 is a flowchart of a method for manufacturing an inter-level dielectric layer for a semiconductor device according to an embodiment of the present invention;

DETAILED DESCRIPTION OF THE INVENTION

The following disclosure provides a plurality of different embodiments or examples to achieve different structures of the present invention. To simplify the disclosure of the present invention, description of the components and arrangements of specific examples is given. Of course, they are only illustrative and not limiting the present invention. Moreover, in the present invention, reference number(s) and/or letter(s) may be repeated in different embodiments. Such repetition is for the purposes of simplification and clearness, and does not denote the relationship between the respective embodiments and/or arrangements being discussed. In addition, the present invention provides various examples for specific processes and materials. However, it is obvious for a person of ordinary skill in the art that other process and/or materials may alternatively be utilized. Furthermore, the following structure in which a first object is "on" a second object may comprise an embodiment in which the first object and the second object are formed to be in direct contact with each other, and may also comprise an embodiment in which another object is formed between the first object and the second object such that the first and second objects might not be in direct contact with each other.

Figure 3:
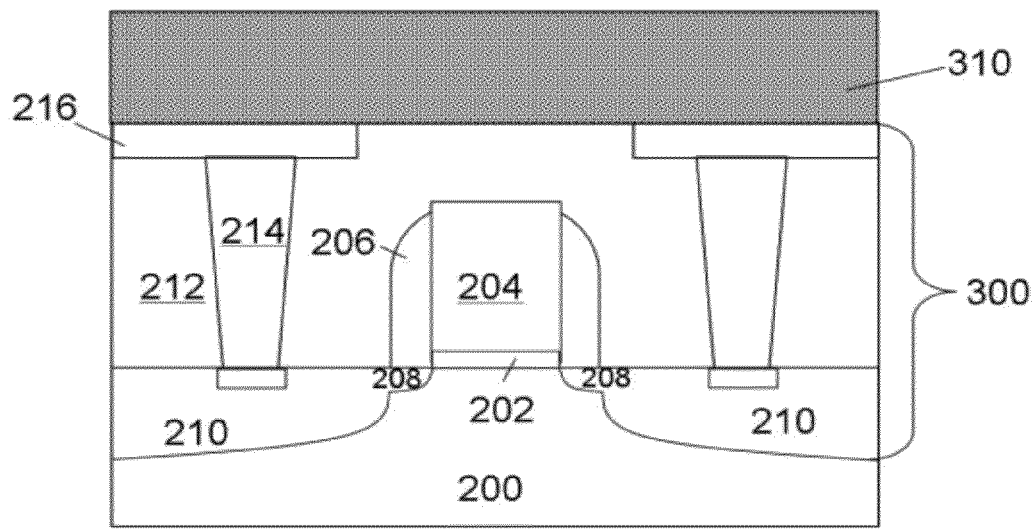
FIGS. 3-15 illustrate diagrams of each step in manufacturing an inter-level dielectric layer for a semiconductor device according to an embodiment of the present invention.

FIG. 2 is a flowchart of a method for manufacturing an inter-level dielectric layer for a semiconductor device according to an embodiment of the present invention. In step S01, a semiconductor substrate 200 and a predetermined device 300 formed thereon are provided, as shown in FIG. 3. The substrate 200 comprises a crystalline silicon substrate (for example, a wafer), and may further comprise other basic semiconductors or compound semiconductors, such as Ge, SiGe, GaAs, InP, SiC or diamond. According to the design specifications known in the prior art (for example, a p-type substrate or an n-type substrate), the substrate 200 may be of various doping configurations. Additionally, the substrate 200 may optionally comprise an epitaxial layer, may be under stress to enhance performance, and may comprise a SOI (silicon on insulator) structure.

The predetermined device 300 may be provided with transistor(s), diode(s), inter-level dielectric layer(s), other semiconductor assembly/assemblies or other metal interconnect layer(s). With reference to FIG. 3 which illustrates an embodiment for the predetermined device 300 of the present invention, a gate dielectric layer 202 and a gate electrode 204 are formed sequentially on the semiconductor substrate 200. Next, ion implantation is performed such that source/drain shallow junctions 208 are formed within the semiconductor substrate 200. The source/drain shallow junctions 208 may comprise source/drain extension regions and/or halo regions. Next, sidewall spacers 206 are formed at the sidewalls of the gate dielectric layer 202 and the gate electrode 204, and then ion implantation is performed with the gate electrode 204 and the sidewall spacers 206 serving as a mask, such that source/drain regions 210 are formed in the semiconductor substrates at both sides of the gate electrode 204 and then are annealed for diffusion. Next, an inter-level dielectric layer 212 is formed to cover the device. Contacts 214 are formed within the inter-level dielectric layer 212 between the source/drain regions 210, and then a first metal interconnect layer 216 is formed on the contacts 214. Aforesaid structure and forming method of the predetermined device is only exemplary, thus it may be other semiconductor devices, and may further comprise other semiconductor elements and other dielectric layers, other metal interconnect layers or the like. The disclosure here is only exemplary and thus should not be interpreted as a limitation to the present invention.

In step S02, a dielectric layer 310 is formed on said predetermined device 300, as shown in FIG. 3. The dielectric layer 310 may be formed by way of depositing a dielectric material on the predetermined device 300, wherein the dielectric material may be $SiO_2$ or any other dielectric material. The dielectric layer 310 may be formed by means of conventional deposition processes, for example, sputtering, Pulsed Laser Deposition (PLD), Metal Organic Chemical Vapor Deposition (MOCVD), Atomic Layer Deposition (ALD), Plasma Enhanced ALD (PEALD) or other processes as appropriate.

Figure 4:
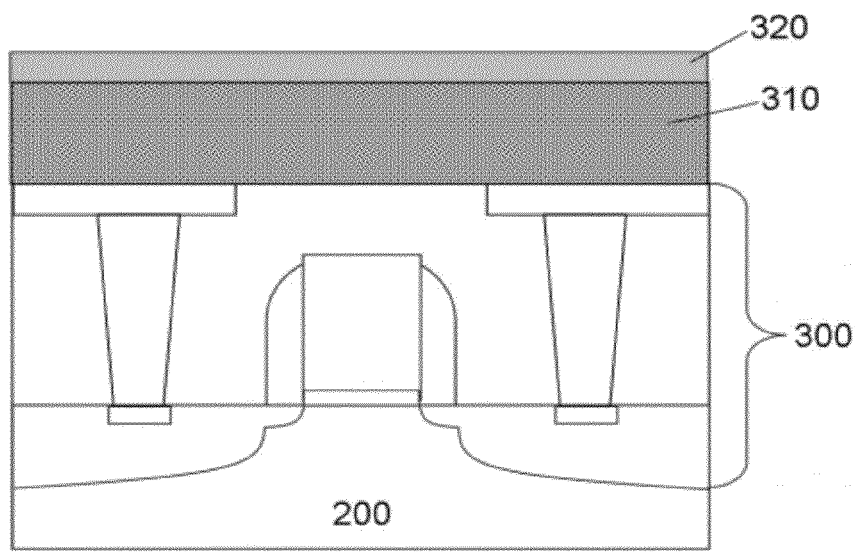
Figure 5:
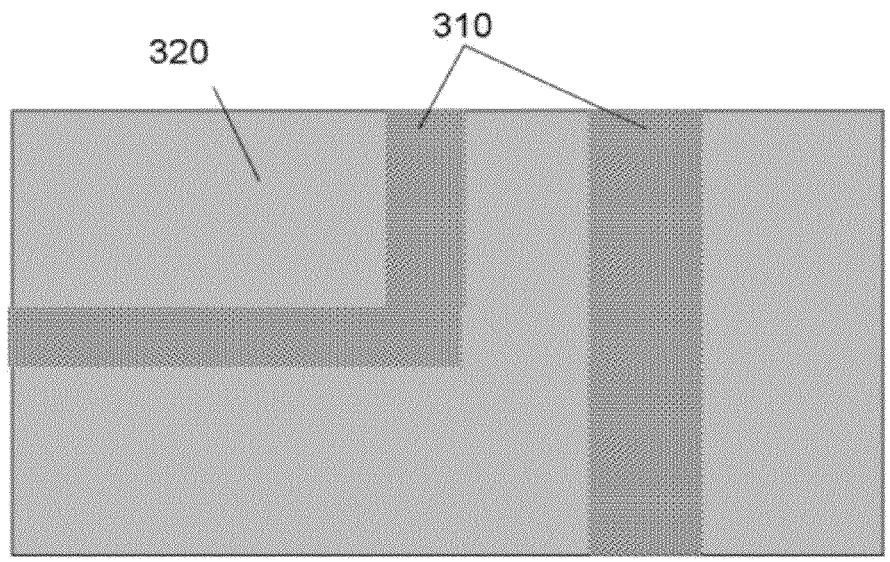
Figure 6:
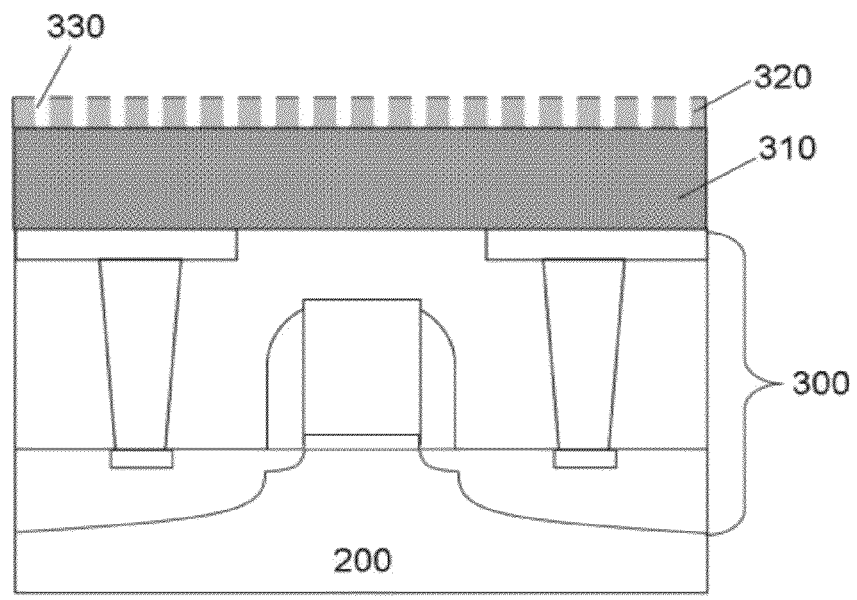
Figure 7:
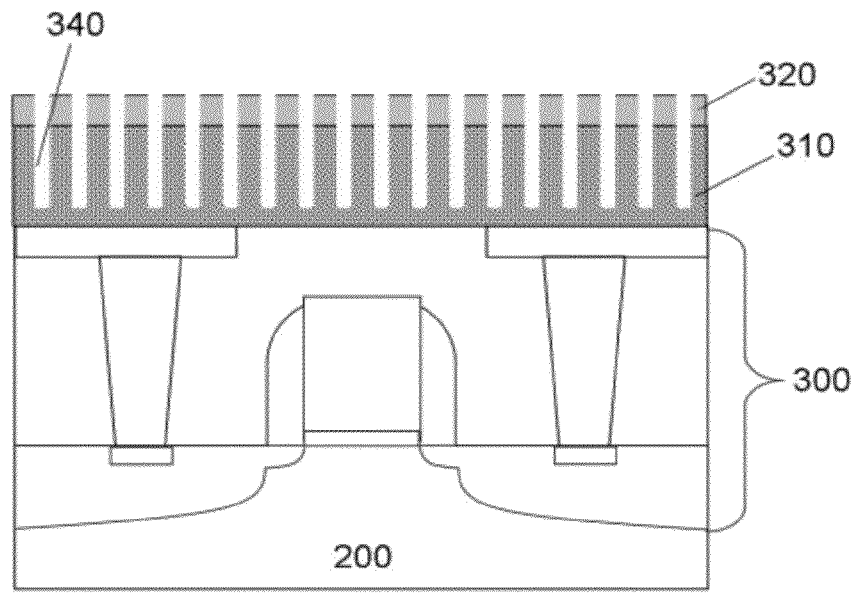
Figure 16:
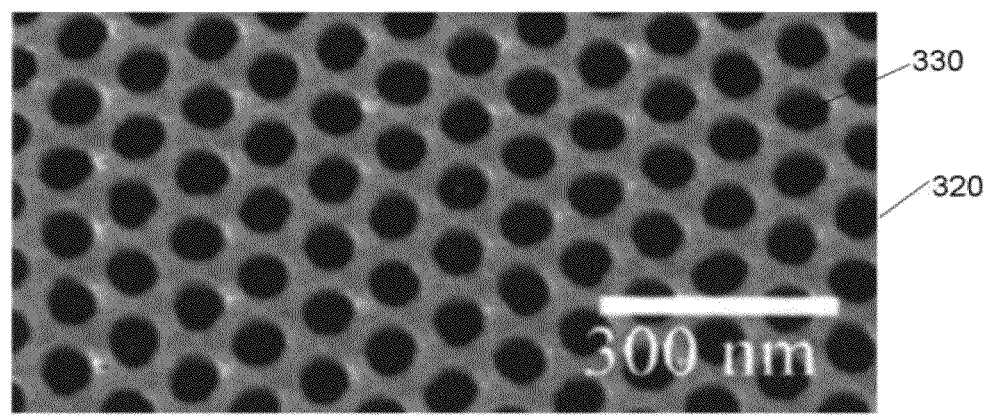
FIG. 16 illustrates a diagram of an Aluminum Oxide ($Al_2O_3$) plate in an embodiment of the present invention.

In step S03, a plurality of holes 340 are formed within said dielectric layer 310, wherein these holes 340 do not penetrate through the dielectric layer 310, as shown in FIG. 7. In the embodiment of the present invention, a mask plate with a plurality of through holes may be formed, and then the mask plate serves as a mask for etching said dielectric layer so as to form the holes, which do not penetrate through the dielectric layer, within said dielectric layer. FIG. 4 to FIG. 6 illustrate a preferred embodiment of forming a mask plate of the present invention. First, metal Al is deposited on the dielectric layer 310 to form a metal Al layer 320, as shown in FIG. 4. Optionally, the metal Al layer 320 may be further patterned to leave only a part of the metal Al layer 320 as appropriate, as shown in FIG. 5. Next, the process of forming Anodic Aluminum Oxide (AAO) is performed such that the metal Al layer 320 is oxidized to form an aluminum oxide plate 320 which contains a plurality of through holes 330, as shown in FIG. 6. FIG. 16 illustrates the structure of the aluminum oxide plate 320 formed by means of AAO process. The aluminum oxide plate 320 contains a plurality of through holes 330 which have uniform sizes and substantially identical shapes, and are arranged periodically. The diameter of the through hole is about 1 to 60 nm, and the spacing between the through holes is about 1 to 60 nm.

Figure 12:
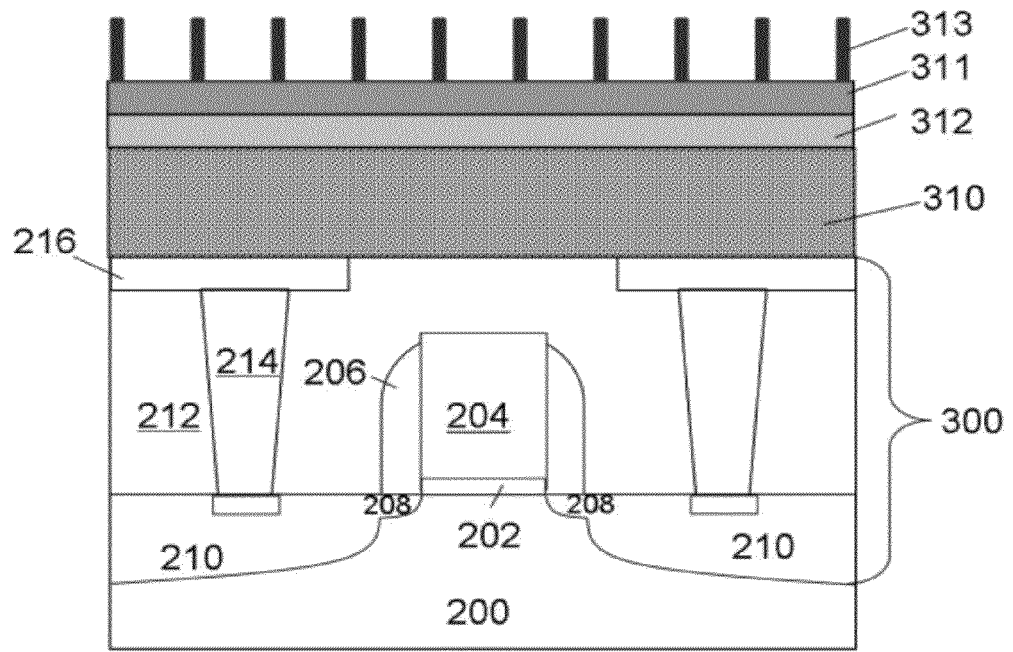
Figure 13:
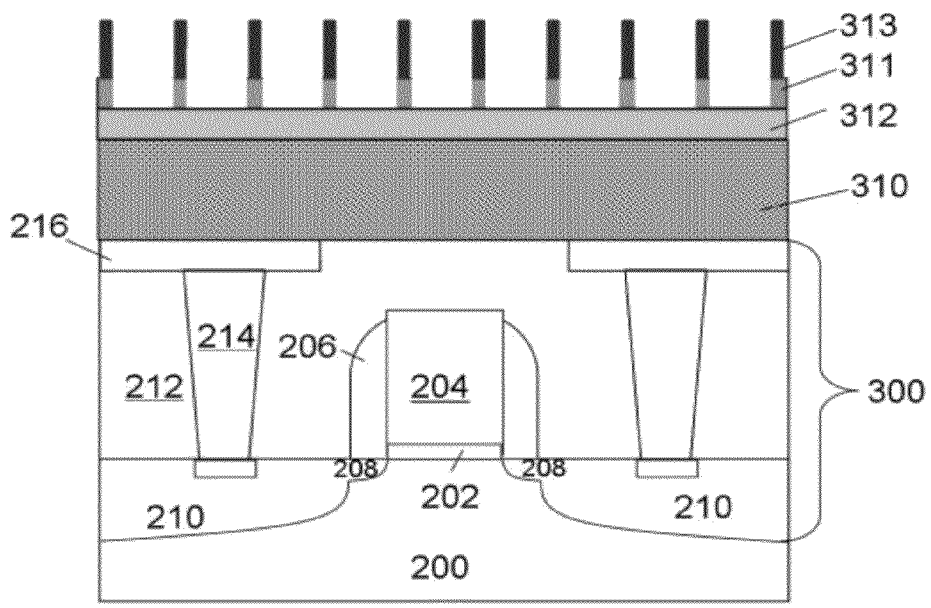
Figure 14:
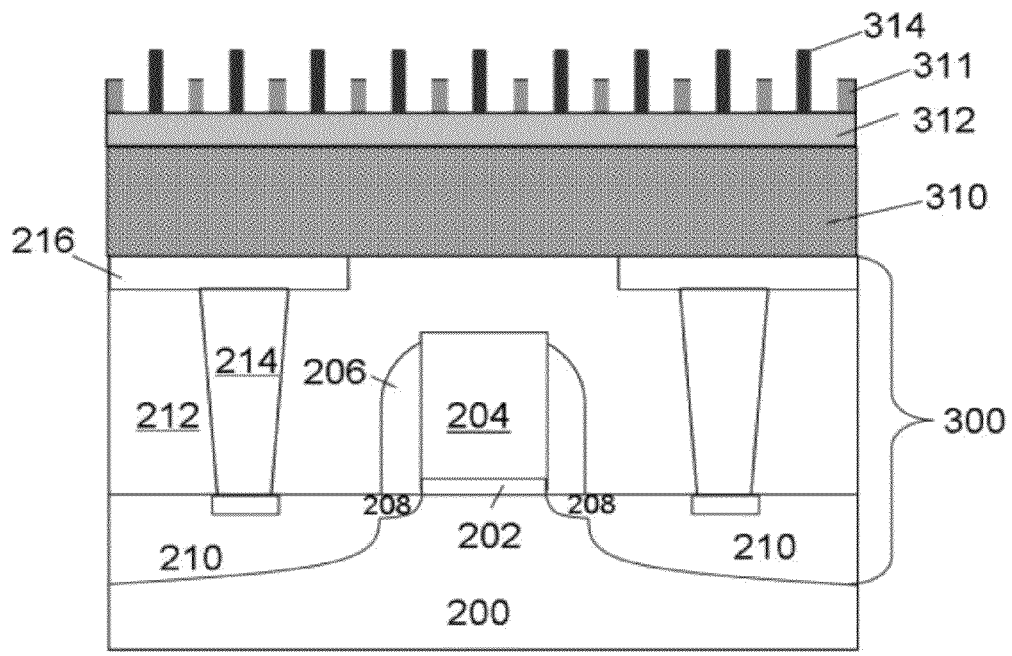
Figure 15:
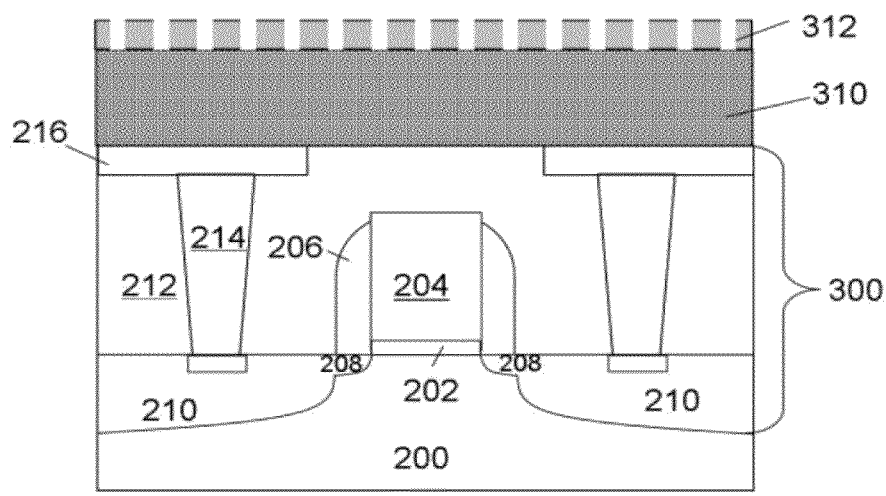

In another embodiment, the holes may further be used for forming a mask plate with through holes of small diameter and spacing by means of a complicated lithography process. In another embodiment, a mask plate may be formed by means of a Litho-Etching-Litho-Etching (LELE) process, wherein FIGS. 12 to 15 show illustrations of forming a mask plate by means of LELE. First, a first hard mask layer 311 and a second hard mask layer 312 are formed on the dielectric layer, as shown in FIG. 12. Then, a first mask 313 is formed, for example, by performing a first exposure after applying a photo-resist layer. Next, the first hard mask layer 311 is patterned and etched, and the first mask 313 is removed, as shown in FIG. 13. Then, a second mask 314 is formed, for example, by performing a second exposure after applying a further photo-resist layer, as shown in FIG. 14. Then, the second hard mask layer 312 is patterned and etched with the second mask 314 and the patterned first hard mask layer 311 as a mask. Then the mask 314 and the first hard mask layer 311 are removed so as to form a mask plate 312 with through holes of small diameter and small spacing, as shown in FIG. 15.

In another embodiment, a mask plate (not shown) with through holes having small diameter and small spacing may be formed by means of a Litho-Freeze Litho-Etch (LFLE) method. Specifically, a hard mask layer is formed on a dielectric layer, and then a mask, for example, a photo-resist layer, is formed thereon. Next, a first exposure is performed to the photo-resist layer, and freezing is conducted. Afterwards, a second exposure is performed to form a mask with small diameter through holes. And then the hard mask layer is etched so as to form a mask plate with through holes of small diameter and small spacing.

In another embodiment, it is also possible to form a mask plate (not shown) with through holes of small diameter and small spacing by means of patterning with the aid of spacer method. Specifically, a hard mask layer is formed on a dielectric layer, and then assisting layers and sidewall spacers thereof being arranged alternatively are formed on the hard mask layer, then the assisting layers are removed, and the hard mask layer is patterned with the spacers as a mask so as to form a mask plate with a plurality of through holes.

The mask plate formed according to aforesaid methods contains a plurality of through holes which are arranged periodically and have small diameter and small spacing. The diameter of the through holes is about 1 to 60 nm, and the spacing between through holes is about 1 to 60 nm.

Next, with the mask plate as a mask, the dielectric layer 310 is etched through the through holes on the mask plate to form holes 340 therein by means of etching such as RIE. The holes 340 do not penetrate through the dielectric layer 310, as shown in FIG. 7. After the formation of the plurality of holes 340 within the dielectric layer 310, it is optional to remove the mask plate so as to form holes of small diameter and small spacing within the dielectric layer.

Figure 8:
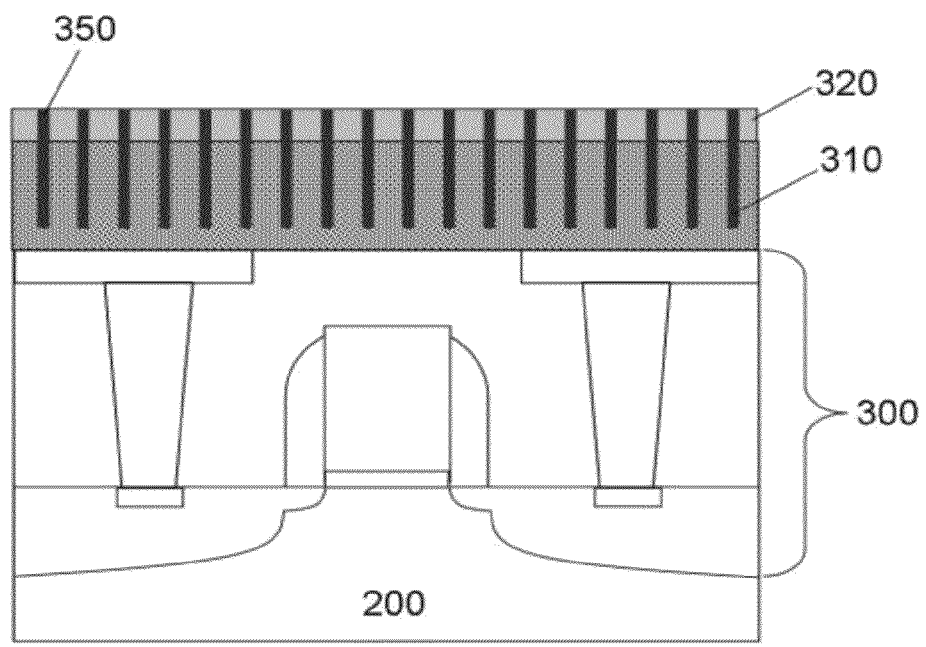
Figure 9:
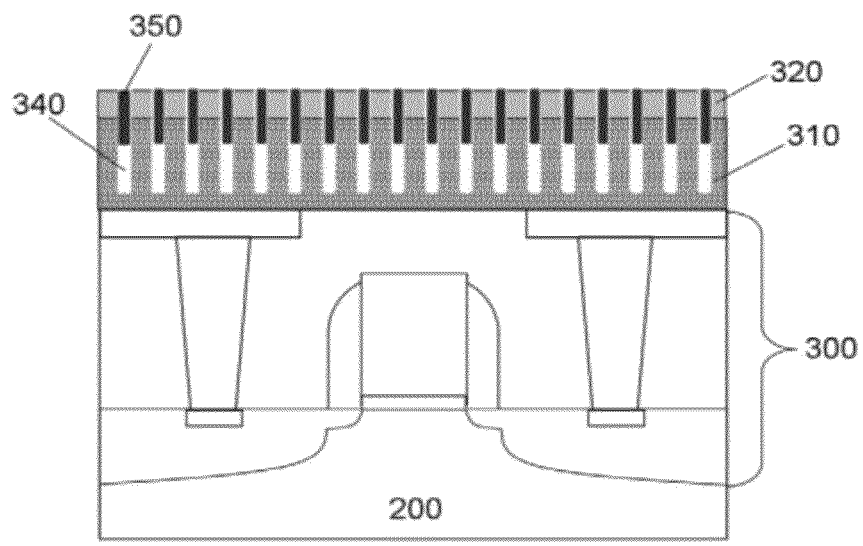
Figure 10:
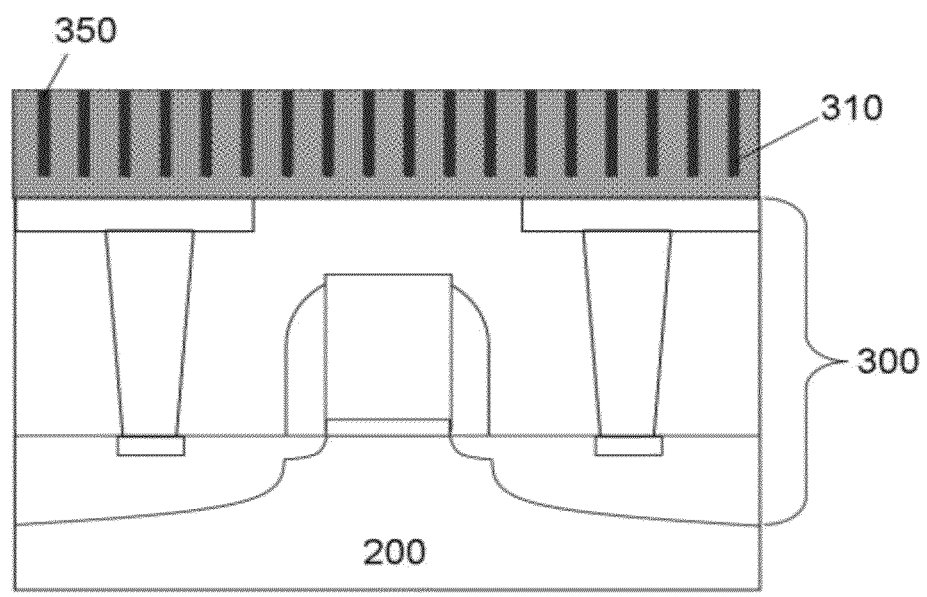
Figure 11:
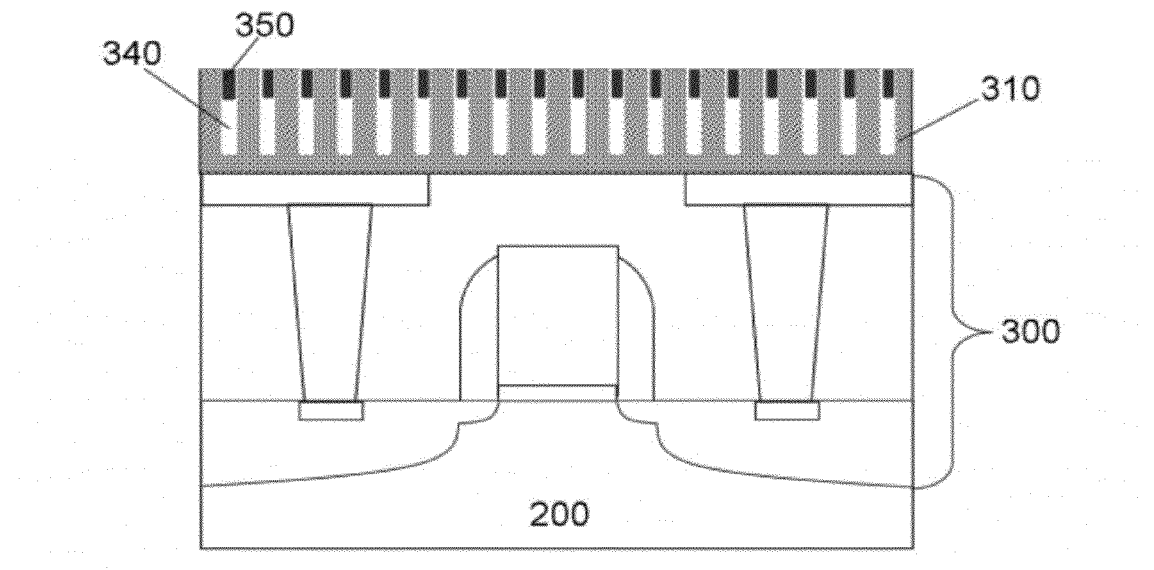

In step S04, the holes 340 are filled up to form hole-sealing dielectric layers 350 whose upper surfaces are substantially flush with those of the dielectric layer 310. In an embodiment of the present invention, the hole-sealing dielectric layers 350 may be formed by way of filling up the holes 340 with a dielectric material, as shown in FIG. 8. The hole-sealing dielectric layers 350 are preferably made of a low-k dielectric material with a low dielectric constant, for example, porous materials of MSQ, PAE, SiLK, SiO.sub.2 and amorphous carbon having a dielectric constant in the range of about 1.1 to 2.0, and may be formed by means of such deposition methods as SOD, CVD or other methods as appropriate. In another embodiment of the present invention, hole-sealing dielectric layers 350 may be formed by way of filling the upper parts of the holes 340, as shown in FIG. 9. The hole-sealing dielectric layers 350 may be made of any dielectric material, for example, SiO.sub.2, Si.sub.3N.sub.4 or the like, and are preferably made of a large-atom material by means of a rapid deposition process. Then, the device is planarized by means of a wet etching or CMP method to remove the hole-sealing dielectric layers 350 on the dielectric layer 310 and the aluminum oxide plate 320, such that the upper surfaces of the hole-sealing dielectric layers 350 are substantially flush with those of the dielectric layer 310, thereby forming an inter-level dielectric layer as shown in FIG. 10 and FIG. 11. Then, other subsequent processing steps may be performed as needed. For example, another metal interconnect layer may be formed therein or thereon, and another inter-level dielectric layer or another structures may be formed.

The method for forming an inter-level dielectric layer according to the embodiment of the present invention has been described above. According to the method of the present invention, it is possible to form non-interconnected holes in a dielectric layer with low dielectric constant. The holes may be filled up with a porous low-k dielectric material with lower dielectric constant, or only the upper parts of the holes are filled to form holes within the dielectric layer. An inter-level dielectric layer with such a structure has a much lower dielectric constant, which reduces RC delay between devices of integrated circuits and is also easy to integrate. Besides, since the holes within the dielectric layer are not interconnected, they may not cause change to the dielectric constant of the dielectric material or shorts between the wires. Thus the device may have better stability and reliability which thence improve performance of the circuit.

The present invention further provides an inter-level dielectric layer for a semiconductor device formed according to aforesaid method. As shown in FIGS. 10-11, the device comprises a semiconductor substrate 200 and a predetermined device 300 formed thereon. The inter-level dielectric layer comprises: a dielectric layer 310 formed on the predetermined device 300; a plurality of holes 340 formed within the dielectric layer 310, wherein the holes 340 do not penetrate through the dielectric layer 310; hole-sealing dielectric layers 350 formed within the holes 340. The dielectric layer 310 may be preferably made of a dielectric material with a low dielectric constant. The hole-sealing dielectric layers 350 in the holes 340 may fill up the holes 340 or fill the upper parts of the holes 340. When the holes 340 are filled up with hole-sealing dielectric layers 350, as shown in FIG. 10, a porous dielectric material with a lower dielectric constant is preferably employed, for example, the porous materials of MSQ, PAE, SiLK, SiO$_2$ and amorphous carbon having a dielectric constant in the range of about 1.1 to 2.0. When only the upper parts of the holes 340 are filled with the hole-sealing dielectric layers 350, as shown in FIG. 11, any dielectric material such as SiO$_2$, Si$_3$N$_4$ or the like may be employed in this case. The holes may be substantially arranged periodically and may be in a substantially identical shape. The holes may have a diameter of 1-60 nm, and the spacing between the holes may be 1-60 nm. The inter-level dielectric layer in such a structure has a much lower dielectric constant, which thus reduces RC delay between devices of integrated circuits. Since the holes within the dielectric layer are not interconnected, they may not cause change to the dielectric constant of the dielectric material or shorts between the wires, and the device may have better stability and reliability which thence improve performance of the circuit.

The present invention further provides a semiconductor device with such an inter-level dielectric layer. As shown in FIGS. 10-11, the device comprises: a semiconductor substrate 200 and a predetermined device 300 formed thereon; a dielectric layer 310 formed on the predetermined device 300; a plurality of holes 340 formed within the dielectric layer 310, wherein the holes 340 do not penetrate through the dielectric layer 310; hole-sealing dielectric layers 350 formed within the holes 340. The dielectric layers 350 may be preferably made of a dielectric material with a low dielectric constant. The hole-sealing dielectric layers 350 in the holes 340 may fill up the holes 340 or fill the upper parts of the holes 340. When the holes 340 are filled up with hole-sealing dielectric layers 350 as shown in FIG. 10, a porous dielectric material with a much lower dielectric constant is preferred to be employed, for example, the porous materials of MSQ, PAE, SiLK, SiO$_2$ and amorphous carbon having a dielectric constant in the range of 1.1 to 2.0. When only the upper parts of the holes 340 are filled with the hole-sealing dielectric layers 350, as shown in FIG. 11, any dielectric material may be employed in this case, for example, SiO$_2$, Si$_3$N$_4$ or the like. The holes may be substantially arranged periodically and may have a substantially identical shape. The holes may have a diameter of about 1-60 nm, and the spacing between the holes may be 1-60 nm. A semiconductor device with an inter-level dielectric layer in such a structure has a much lower dielectric constant, which thus reduces RC delay between devices of integrated circuits. Since the holes within the dielectric layer are not interconnected, they may not cause mechanical changes of the dielectric material or shorts between the wires, and the device may have better stability and reliability which hence improve performance of the circuits.

The predetermined device 300 in aforesaid inter-level dielectric layer and semiconductor device may comprise transistor(s), diode(s), inter-level dielectric layer(s), other semiconductor assembly/assemblies or other metal interconnect layer(s). With reference to FIG. 3 illustrating an embodiment for the predetermined device 300 of the present invention, the predetermined device 300 comprises: a gate dielectric layer 202, a gate electrode 204 and sidewall spacers 206 on a semiconductor substrate 200, source/drain shallow junctions 208 and source/drain regions 210 in the substrate 200, an inter-level dielectric layer 212 that covers the source/drain regions, a contract 214 and a first metal interconnect layer 216. The structure of aforesaid predetermined device 300 is only exemplary, and thus it may be other semiconductor device structures, and may further comprise other semiconductor elements, other dielectric layers, or other metal interconnect layers. The disclosure here is only exemplary and thus should not be interpreted as a limitation to the present invention.

Although the embodiments and their advantages have been described in detail, it is readily apparent to those having ordinary skill in the art that various alterations, substitutions and modifications may be made to the embodiments without departing from the spirit of the present invention and the scope defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention comprises these process, mechanism, manufacture, material composition, means, methods or steps.

What is claimed is:

1. A method for manufacturing an inter-level dielectric layer for a semiconductor device, comprising:
    A. providing a semiconductor substrate and a predetermined device formed thereon;
    B. forming a dielectric layer on the predetermined device;
    C. forming a plurality of holes within the dielectric layer, wherein the plurality of holes do not penetrate through the dielectric layer;
    D. filling the plurality of holes to form hole-sealing dielectric layers, wherein upper surfaces of the hole-sealing dielectric layers are substantially flush with those of the dielectric layer, wherein the hole-sealing dielectric layers fill the upper parts of the holes.

2. The method according to claim 1, wherein the step C comprises: forming a mask plate with a plurality of through holes on the dielectric layer, and etching the dielectric layer with the mask plate as a hard mask so as to form holes within the dielectric layer which do not penetrate through.

3. The method according to claim 2, wherein the step for forming a mask plate comprises: forming a metal Al layer on the dielectric layer, oxidizing the metal Al layer into an aluminum oxide plate containing a plurality of through holes, and the aluminum oxide plate serving as a mask plate.

4. The method according to claim 2, wherein the step for forming a mask plate comprises: sequentially forming a second hard mask layer and a first hard mask layer on the dielectric layer; forming a patterned first hard mask layer by a first masking process; and forming a patterned second hard mask layer by a second masking process and the patterned first hard mask layer, thereby forming a mask plate containing a plurality of through holes.

5. The method according to claim 2, wherein the step for forming a mask plate comprises: forming a hard mask layer on the dielectric layer; by means of using lithography masks and double patterning to form a hard mask plate containing a plurality of through holes.

6. The method according to claim 2, wherein the step for forming the mask plate comprises: forming a hard mask layer on the dielectric layer; forming an assisting layer and its sidewall spacer which are arranged alternatively on the hard mask layer; removing the assisting layer and patterning the hard mask layer with the sidewall spacer as a mask, thereby forming a mask plate containing a plurality of through holes.

7. The method according to claim 1, wherein the plurality of holes and the through holes are substantially arranged periodically and are in a substantially identical shape.

8. An inter-level dielectric layer for a semiconductor device, the device comprises a semiconductor substrate and a predetermined device formed thereon, and the inter-level dielectric layer comprises:
    a dielectric layer formed on the predetermined device;
    a plurality of holes formed within the dielectric layer, wherein the plurality of holes do not penetrate through the dielectric layer; and
    hole-sealing dielectric layers formed in the plurality of holes, wherein the hole-sealing dielectric layers fill the upper parts of the holes.

9. The inter-level dielectric layer according to claim 8, wherein the holes are substantially arranged periodically and are in substantially identical shape.

10. A semiconductor device having an inter-level dielectric layer, comprising:
    a semiconductor substrate and a predetermined device positioned thereon;
    a dielectric layer formed on the predetermined device;
    a plurality of holes formed within the dielectric layer, wherein the plurality of holes do not penetrate through the dielectric layer; and
    hole-sealing dielectric layers formed in the plurality of holes, wherein the hole-sealing dielectric layers fill the upper parts of the holes.

11. The device according to claim 10, wherein the plurality of holes are substantially arranged periodically, and are in substantially identical shape.

12. The method according to claim 1, wherein the spacing between the holes is about 1-60 nm.

13. The inter-level dielectric layer according to claim 8, wherein the spacing between the holes is about 1-60 nm.

14. The device according to claim 10, wherein the spacing between the holes is about 1-60 nm.

15. The method according to claim 1, wherein the diameter of the holes is about 1-60 nm.

16. The inter-level dielectric layer according to claim 8, wherein the diameter of the holes is about 1-60 nm.

17. The device according to claim 10, wherein the diameter of the holes is about 1-60 nm.

* * * * *